(12) United States Patent
Jeon

(10) Patent No.: US 7,687,306 B2
(45) Date of Patent: Mar. 30, 2010

(54) CMOS IMAGE SENSOR AND METHOD FOR MANUFACTURING THE SAME

(75) Inventor: In Gyun Jeon, Gunpo-si (KR)

(73) Assignee: Dongbu Electronics Co., Ltd., Seoul (KR)

( * ) Notice: Subject to any disclaimer, the term of this patent is extended or adjusted under 35 U.S.C. 154(b) by 450 days.

(21) Appl. No.: 11/447,424

(22) Filed: Jun. 5, 2006

(65) Prior Publication Data

US 2006/0273360 A1  Dec. 7, 2006

(30) Foreign Application Priority Data

Jun. 7, 2005  (KR) ...................... 10-2005-0048481

(51) Int. Cl.
*H01L 21/761* (2006.01)
(52) U.S. Cl. ..................... 438/75; 438/60; 438/144; 438/299; 257/E21.617; 257/E21.633
(58) Field of Classification Search ............ 438/60, 438/75, 144, 145, 299, FOR. 136, FOR. 137, 438/FOR. 151, FOR. 424; 257/E21.617, 257/E21.633
See application file for complete search history.

(56) References Cited

U.S. PATENT DOCUMENTS

| | | | |
|---|---|---|---|
| 5,793,090 A * | 8/1998 | Gardner et al. | 257/408 |
| 6,040,593 A * | 3/2000 | Park | 257/292 |
| 6,184,055 B1 * | 2/2001 | Yang et al. | 438/57 |
| 6,661,045 B2 * | 12/2003 | Ishiwata | 257/290 |
| 7,148,528 B2 * | 12/2006 | Rhodes | 257/292 |
| 7,214,575 B2 * | 5/2007 | Rhodes | 438/197 |

(Continued)

FOREIGN PATENT DOCUMENTS

KR  10-0304975  7/2001

OTHER PUBLICATIONS

Hun Choi and Gwang Hui Han: "Method for Manufacturing Semiconductor Device"; Korean Patent Abstracts: Publication No. 100304975 B1: Publication Date: Jul. 25, 2001; Korean Intellectual Property Office, Republic of Korea.
"CMOS Image Sensor and Method for Manufacturing the Same"; Chinese Office Action dated Mar. 21, 2008 and English Translation; Chinese Patent Application No. 200610083371.6; State Intellectual Property Office of People's Republic of China. Republic of China.

*Primary Examiner*—Julio J. Maldonado
(74) *Attorney, Agent, or Firm*—The Law Offices of Andrew D. Fortney; Andrew D. Fortney; Sharon E. Brown Turner

(57) ABSTRACT

A CMOS image sensor and manufacturing method thereof are disclosed. The present CMOS image sensor comprises: a semiconductor substrate including an active region having a photo diode region and a transistor region; a gate on the active region, comprising a gate insulating layer and a gate electrode thereon; a first source/drain diffusion region in the transistor region at one side of the gate electrode, including a first conductivity type dopant; a second photo diode diffusion region in the region at the other side of the gate electrode, the second diffusion region including a first conductivity type dopant; insulating sidewalls on sides of the gate electrode; and a third diffusion region over or in the second diffusion region, extending below one of the insulating sidewalls (e.g., closest to the photo diode region), and including a second conductivity type dopant.

10 Claims, 15 Drawing Sheets

U.S. PATENT DOCUMENTS

| | | | |
|---|---|---|---|
| 2002/0117699 A1* | 8/2002 | François | 257/291 |
| 2004/0180458 A1* | 9/2004 | Yi-tae | 438/22 |
| 2005/0088556 A1 | 4/2005 | Han | |
| 2005/0167708 A1* | 8/2005 | Rhodes et al. | 257/291 |

* cited by examiner

FIG.9

| Pixel Performance @60°C | | Unit | A | B | C | D | E |
|---|---|---|---|---|---|---|---|
| Dark Signal | | [mV/sec] | 145.8 | 107.4 | 86.4 | 82.8 | 58.8 |
| Sensitivity | | [V/lux-sec] | 2.30 | 2.31 | 2.31 | 2.38 | 2.36 |
| Signal Level @2[Lux] | | [mV] | 625.2 | 618.7 | 618.7 | 640.8 | 634.3 |
| S/N Ratio @1[Lux] | | [dB] | 25.57 | 28.75 | 28.15 | 28.43 | 29.62 |

CMOS IMAGE SENSOR AND METHOD FOR MANUFACTURING THE SAME

This application claims the benefit of Korean Patent Application No. 10-2005-0048481, filed on Jun. 7, 2005, which is incorporated by reference herein in its entirety.

BACKGROUND OF THE INVENTION

1. Field of the Invention

The present invention relates to an image sensor, more specifically, to a complementary metal oxide semiconductor (CMOS) image sensor and manufacturing method thereof.

2. Description of the Related Art

Conventionally, an image sensor, as a kind of semiconductor device, transforms optical image into electrical signal, which can be generally classified into a charge coupled device (CCD) and a CMOS image sensor.

A CCD comprises a plurality of photo diodes arranged in the form of matrix to transform optical signal into electrical signal, a plurality of vertical charge coupled devices (VCCDs) formed between the photo diodes to transmit charges generating in each photo diode in a vertical direction, a plurality of horizontal charge coupled devices (HCCDs) for transmitting charges transmitted from each VCCDs in a horizontal direction, and a sense amp for sensing charges transmitted in the horizontal direction to output electrical signals.

It has been generally known that CCDs have complicated operational mechanism, and high power consumption. In addition, its manufacturing method is very complicated, because multiple steps of photolithography processes are required in its fabrication. Especially, it is difficult to integrate a CCD with other devices such as control circuits, signal processing circuits, analog/digital converter, etc., in a single chip. Such disadvantage of CCD hinders miniaturization of products.

In order to overcome above described disadvantages of CCDs, CMOS image sensors have been recently developed as the oncoming generation of image sensor. A CMOS image sensor generally comprises MOS transistors formed in a semiconductor substrate by CMOS fabrication technologies. In a CMOS image sensor, the MOS transistors are formed relative to the number of unit pixels, along with peripheral circuits such as control circuits, signal processing circuits, and the like. CMOS image sensors employ a switching mode that MOS transistors successively detect the output of each pixel.

More specifically, CMOS image sensors comprise a photo diode and MOS transistors in each pixel, thereby successively detecting electrical signals of each pixel in a switching mode to express a given image.

The CMOS image sensor has advantages such as low power consumption and relatively simple fabrication process. In addition, CMOS image sensors can be integrated with control circuits, signal processing circuits, analog/digital converter, etc., because of using CMOS manufacturing technologies, which enables miniaturization of products.

CMOS image sensors has been widely used in a variety of applications such as digital still camera, digital video camera, and the like.

Meanwhile, CMOS image sensors can also be classified into 3T, 4T, 5T types, etc., according to the number of transistors. The 3T type of CMOS image sensor comprises one photo diode and three transistors, and the 4T type comprises one photo diode and four transistors. Here, a layout of unit pixel in a 4T type of CMOS image sensor is configured as follows.

FIG. 1 is a circuit diagram of a conventional 4T type of CMOS image sensor. FIG. 2 is a layout of unit pixel in the conventional 4T type of CMOS image sensor. And, FIG. 3 is a cross-sectional view illustrating a photo diode and a transfer transistor of a conventional CMOS image sensor, in view of I-I' line in FIG. 2.

As shown in FIG. 1, each unit pixel 100 of the conventional CMOS image sensor comprises a photo diode (PD or 10) functioning as a photoelectric transformer, and four transistors including a transfer transistor 20, reset transistor 30, driver transistor 40, and select transistor 50. In addition, the output terminal (referred to as "OUT") of the each unit pixel 100 is electrically connected to a load transistor 60.

In FIG. 1, the reference symbol "FD" represents a floating diffusion region, "Tx" represents a gate voltage of the transfer transistor 20, "Rx" represents a gate voltage of the reset transistor 30, "Dx" represents a gate voltage of the driver transistor 40, and finally "Sx" represents a gate voltage of the select transistor 50.

As shown in FIG. 2, in the conventional CMOS image sensor, an active region is defined in a portion of each unit pixel, and an isolation layer is formed in the remaining portion of each unit pixel except for the active region. One photo diode PD is formed in a large portion of the defined active region, and gate electrodes 23, 33, 43, and 53 of four transistors are respectively formed to be overlapped with other portion of the active region.

The gate electrode 23 constitutes the transfer transistor 20. The gate electrode 33 constitutes the reset transistor 30. The gate electrode 43 constitutes the driver transistor 40. And, the gate electrode 53 constitutes the select transistor 50.

Here, dopant ions are implanted in the active region where each transistor is formed, except for the portion of active region below each gate electrodes 23, 33, 43, and 53, to form source and drain regions of each transistor.

FIG. 3 is a cross-sectional view of the photo diode and the transfer transistor, in the above-described structure of the conventional CMOS image sensor.

Referring to FIG. 3, a P– type epitaxial layer 11 is formed on a P++ type semiconductor substrate, using epitaxial growth process.

The gate electrode 23 for the transfer transistor 20 in FIG. 1 is formed on the epitaxial layer 11, interposing the gate insulating layer 21. The first and second insulating sidewalls 29 and 30 are formed on both sides of gate electrode 23.

In addition, a N– type diffusion region 28 and a P0 type diffusion region 35 are formed in photo diode region of epitaxial layer 11. The P0 type diffusion region 35 is formed over the N– type diffusion region 28 in the photo diode region. Source/drain diffusion regions, consisting of lightly doped drain (LDD) region 26 having a N– conductivity type and a high concentration of N+ diffusion region 32, is formed in the transistor region of epitaxial layer 11.

Here, "P–" type diffusion region represents a doped region by a low concentration of P-type dopants, a "P0" type diffusion region represents a doped region by a middle concentration of P-type dopants, and a "P+" type diffusion region represents a doped region by a high concentration of P-type dopants, and finally a "P++" type diffusion region represents a doped region by a higher concentration of P-type dopants. Similarly, "N–" type diffusion region represents a doped region by a low concentration of N-type dopants, and a "N+" type diffusion region represents a doped region by a high concentration of N-type dopants.

FIGS. 4a to 4i are cross-sectional views illustrating a conventional method for manufacturing a CMOS image sensor.

Referring to FIG. 4a, a P− type epitaxial layer 11 is formed on the semiconductor substrate such as single crystalline silicon having a heavy concentration and a first conductivity type (i.e., P++ type).

Here, the epitaxial layer 11 functions to form a deep and wide depletion region in the photo diode region. Thereby, the ability of a low-voltage photo diode for gathering photoelectrons can be improved, and also the light sensitivity can be improved.

Next, a gate insulating layer 21 and a conductive layer (e.g., a heavy doped polysilicon layer) are deposited on the entire surface of the epitaxial layer 11, in successive order. The conductive layer is selectively patterned using photolithography and etching processes, thus forming the gate electrode 23.

The gate insulating layer 21 can be formed using thermal oxidation process or chemical vapor deposition (CVD) process. In addition, the gate electrode 23 can further comprise a silicide layer thereon.

Next, as shown in FIG. 4b, the gate electrode 23 is thermally oxidized so that a thermal oxidation layer 24 is formed on the exposed surface of the gate electrode 23.

Referring to FIG. 4c, a first photoresist layer 25 is applied over the entire surface of the substrate including the gate electrode 23, and then it is patterned using exposure and development processes, thus covering the photo diode region and exposing the transistor region where source/drain regions will be formed.

Using the first photoresist pattern 25 as a mask, a low concentration of N-type dopant ions are implanted in the exposed transistor region to form the N− type diffusion region 26.

As shown in FIG. 4d, after removal of the first photoresist pattern 25, a second photoresist layer 27 is applied over the semiconductor substrate, and then it is patterned using exposure and development processes, thus exposing the photo diode region.

Then, using the second photoresist pattern 27 as a mask, a low concentration of N-type dopant ions are implanted in the photo diode region at an ion implantation energy of 100 keV~500 keV, thus forming the N− type diffusion region 28. Hereinafter, the N− type diffusion region 28 is also referred to as "PDN region."

Meanwhile, the N− type diffusion region 28 of the photo diode region is preferably formed in a diffusion depth more than that of the N− type diffusion region 26 of source/drain regions, using higher implantation energy.

As shown in FIG. 4e, after removing the second photoresist pattern 27, the oxide layer 29a and the nitride layer 30a are formed over the entire surface of the substrate by CVD, e.g., LPCVD (Low Pressure Chemical Vapor Deposition) process.

Continuously, an etch back process is preformed on the oxide layer 29a and the nitride layer 30a to form the first and second insulating sidewalls 29 and 30 on both sides of the gate electrode 23, as shown in FIG. 4f.

As shown in FIG. 4g, a third photoresist layer 31 is formed over the entire surface of the substrate, and then it is patterned by exposure and development processes to cover the photo diode region and expose the transistor region.

Continuously, using the third photoresist pattern 31 as a mask, a high concentration of N-type dopant ions are implanted in source/drain regions to form the N+ type diffusion region 32.

As shown in FIG. 4h, after removing the third photoresist pattern 31, a fourth photoresist layer 34 is applied over the entire surface of the substrate, and then it is patterned by exposure and development processes to expose the photo diode region.

Then, using the fourth photoresist pattern 34 as a mask, a middle concentration of P-type dopant ions are implanted in the photo diode region to form the P0 type diffusion region 35 over the N− type diffusion region 28. Hereinafter, the P0 type diffusion region is also referred to as "PDP region."

Here, the photo diode can comprise only the N− type diffusion region 28, without the P0 type diffusion region 35.

As shown in FIG. 4i, after removing the fourth photoresist pattern 34, heat-treatment process (e.g., rapid thermal process) is performed on the substrate to activate dopants in the N− type diffusion region 26, the P0 type diffusion region 35, the N− type diffusion region 28, and the N+ type diffusion region 32.

However, in the above-described conventional CMOS image sensor, there are problems as follows. Namely, as shown in FIG. 4h, the P-type dopant ions are rarely implanted in the portion of the photo diode region below the first and second insulating sidewalls 29 and 30, because the P-type dopants ions are blocked by the sidewalls 29 and 30 during the implantation process for the P0 type diffusion region 35. As a result, charges accumulated in the photo diode region may leak out in the region where the P-type dopant ions are blocked.

SUMMARY OF THE INVENTION

It is, therefore, an object of the present invention to provide a CMOS image sensor and manufacturing method thereof, wherein the diffusion region for a photo diode is formed below the insulating sidewalls of the gate electrode adjacent to the photo diode, thus enabling reduction of current leakage in the photo diode and improvement of the performance of the CMOS image sensor.

To achieve the above objects, an embodiment of a CMOS image sensor according to the present invention comprises: a semiconductor substrate including an active region having a photo diode region and a transistor region; a gate electrode on the active region, comprising a gate insulating layer and a gate thereon; a source/drain diffusion region in the transistor region at one side of the gate electrode, including a first dopant having a first conductivity type; a second diffusion region in the photo diode region at the other side of the gate electrode, the second diffusion region including a second dopant having the first conductivity type; insulating sidewalls on sides of the gate electrode; and a third diffusion region over or in the second (photo diode) diffusion region, the third diffusion region extending below one of the insulating sidewalls (preferably closest to the photo diode region), including a dopant having a second conductivity type.

In addition, an embodiment of a method for manufacturing a CMOS image sensor according to the present invention comprises the steps of: forming a lightly doped drain in the transistor region at one side of the gate electrode, including a first conductivity type dopant; forming a photo diode diffusion region at an opposite side of the gate electrode, the photo diode diffusion region including the first conductivity type dopant; forming a third diffusion region over or in the second (photo diode) diffusion region, the third diffusion region including a second conductivity type dopant; forming insulating sidewalls on sides of the gate electrode; forming a source/drain diffusion region in the transistor region, partially overlapping with the lightly doped drain and including the first conductivity type dopant; and forming a fifth diffusion region over or in the second diffusion region in the photo diode region, the fifth diffusion region partially overlapping with the third diffusion region, and including the second conductivity type dopant. The method may further comprise preparing a semiconductor substrate including an active region where a photo diode region and a transistor region are defined; forming a gate electrode on the active region, interposing a gate insulating layer the gate electrode and the active region;

Further, another embodiment of a method for manufacturing a CMOS image sensor according to the present invention comprises the steps of: forming a first lightly doped drain diffusion region in the transistor region at one side of the gate electrode, including a first conductivity type dopant; forming a second diffusion region in the photo diode region at the other side of the gate electrode, the second diffusion region including the first conductivity type \ dopant; forming insulating sidewalls on sides of the gate electrode; forming a third source/drain diffusion region in the transistor region, the third diffusion region partially overlapping with the first diffusion region and including the first conductivity type dopant; and forming a fourth diffusion region over or in the second diffusion region using a tilt-implantation process, the fourth diffusion region extending below one of the insulating sidewalls (e.g., closest to the photo diode region), including a second conductivity type dopant. The method may further comprise preparing the semiconductor substrate including an active region having a photo diode region and a transistor region; and forming a gate on the active region, comprising a gate insulating layer and a gate electrode thereon.

These and other aspects of the invention will become evident by reference to the following description of the invention, often referring to the accompanying drawings.

BRIEF DESCRIPTION OF DRAWINGS

FIGS. 8 and 9 show results of experiments on CMOS image sensors according to the present invention, comparing with those of conventional CMOS sensors.

DETAILED DESCRIPTION OF THE INVENTION

Figure 1:
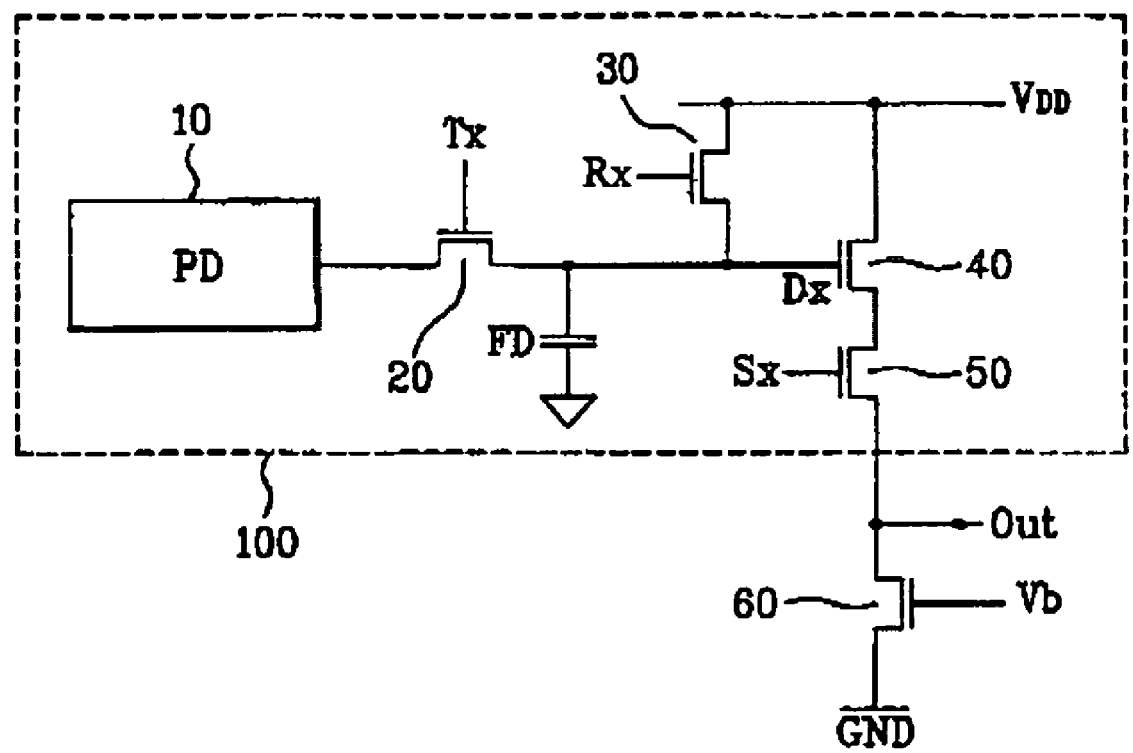
FIG. 1 is a circuit diagram for a 4T type of a conventional CMOS image sensor.
Figure 2:
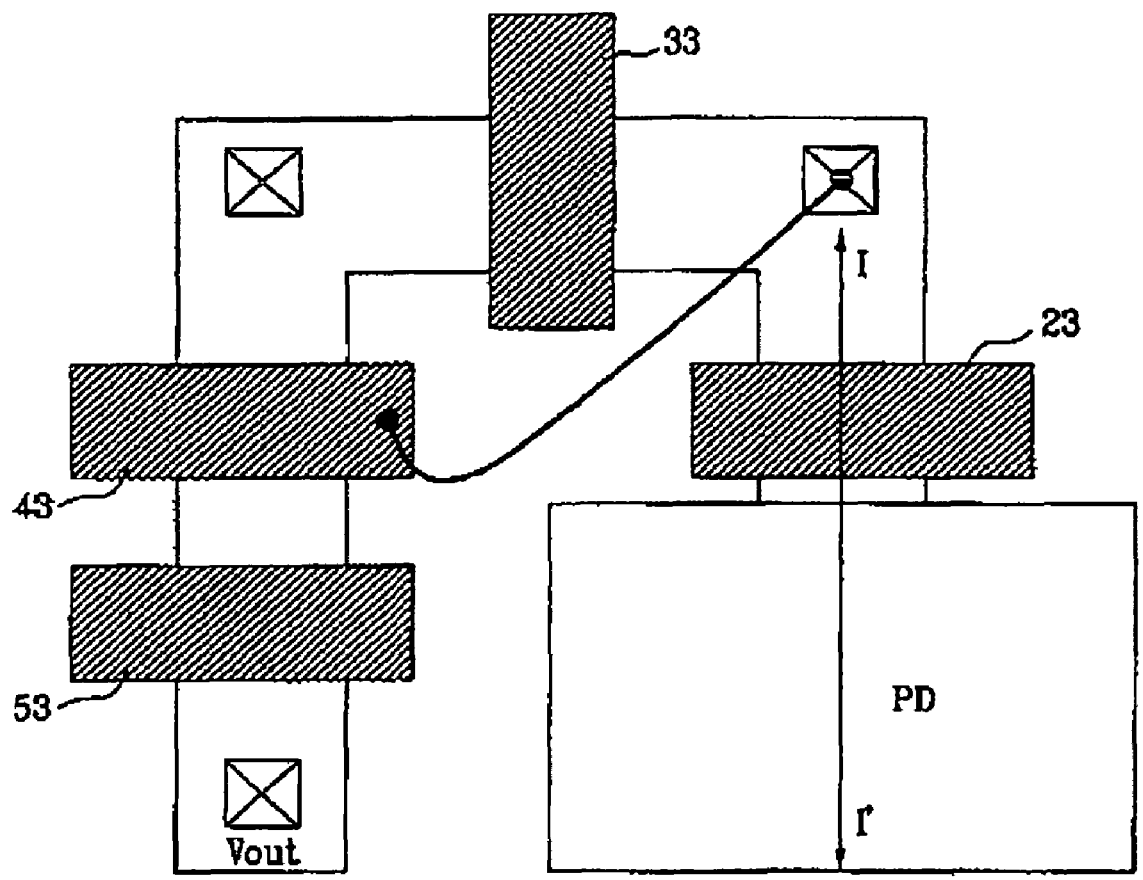
FIG. 2 is a layout of unit pixel of a conventional 4T type of CMOS image sensor.
Figure 3:
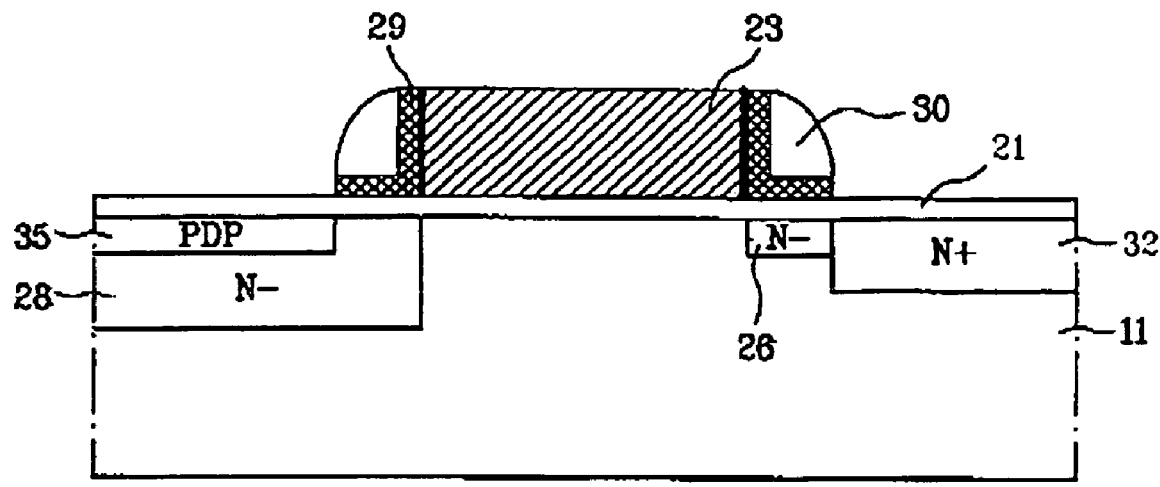
FIG. 3 is a cross-sectional view illustrating a photo diode and a transfer transistor of the conventional CMOS image sensor, in a view of I-I' line in FIG. 2.
Figure 4A:
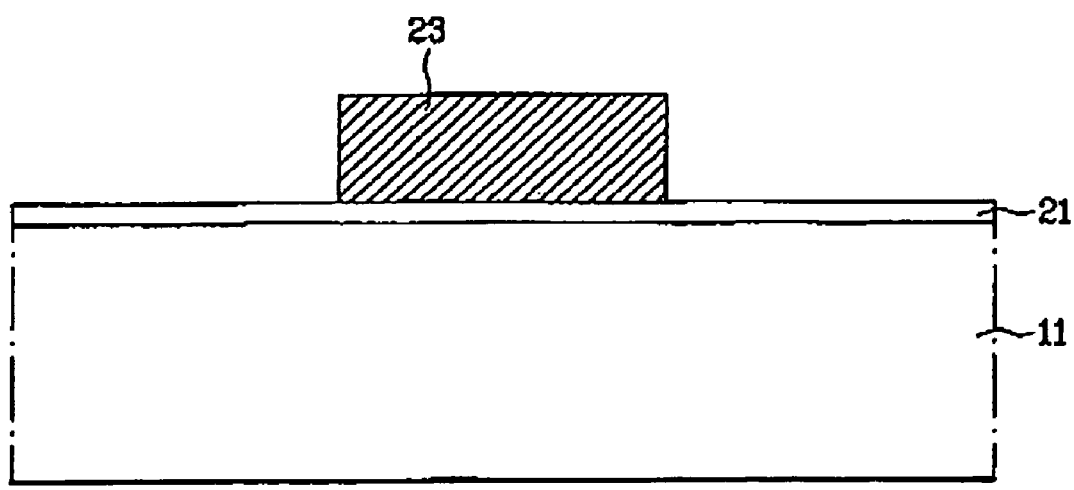
FIGS. 4a to 4i are cross-sectional view illustrating a conventional method for manufacturing a CMOS image sensor.
Figure 4B:
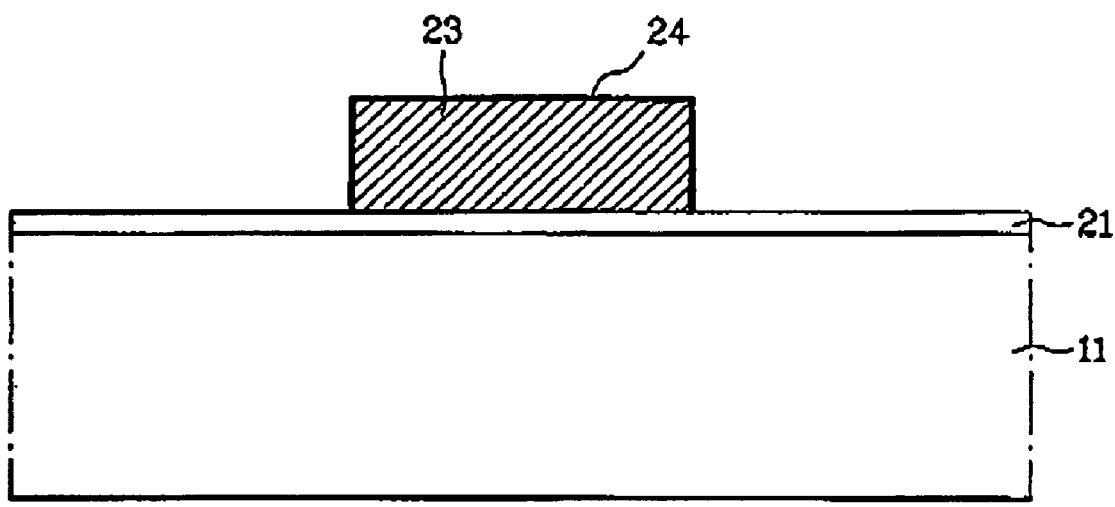
Figure 4C:
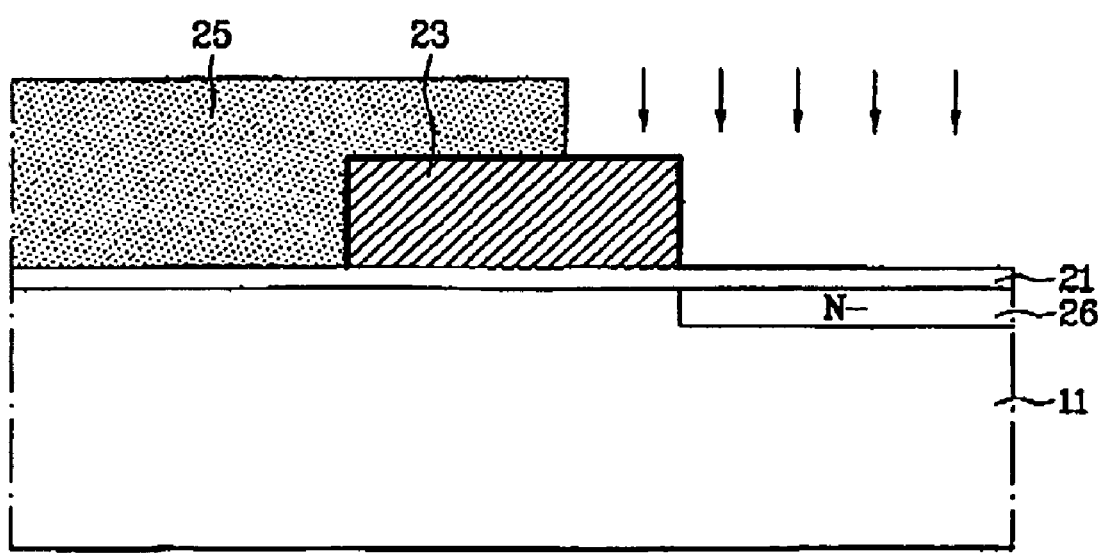
Figure 4D:
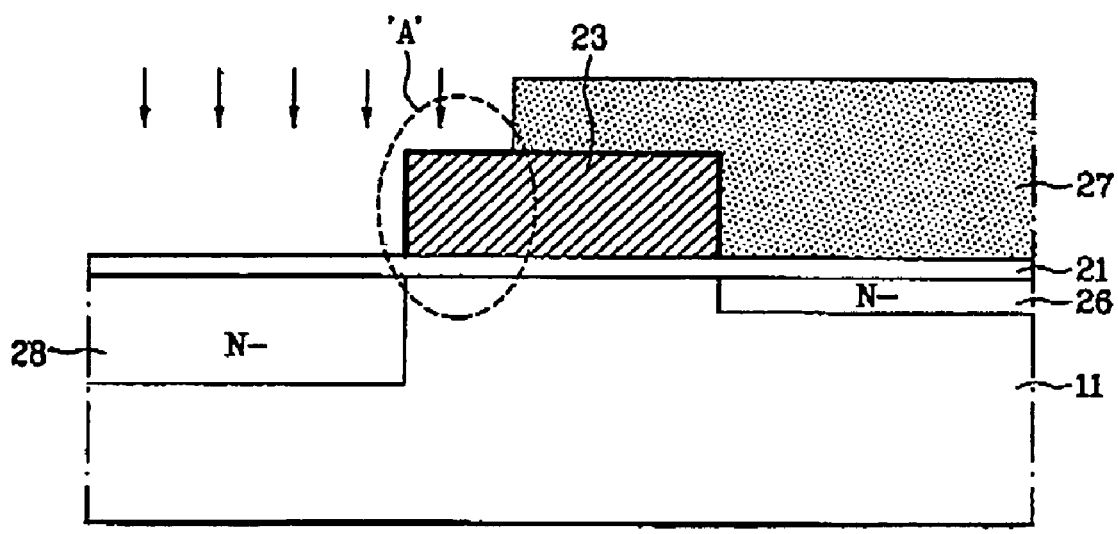
Figure 4E:
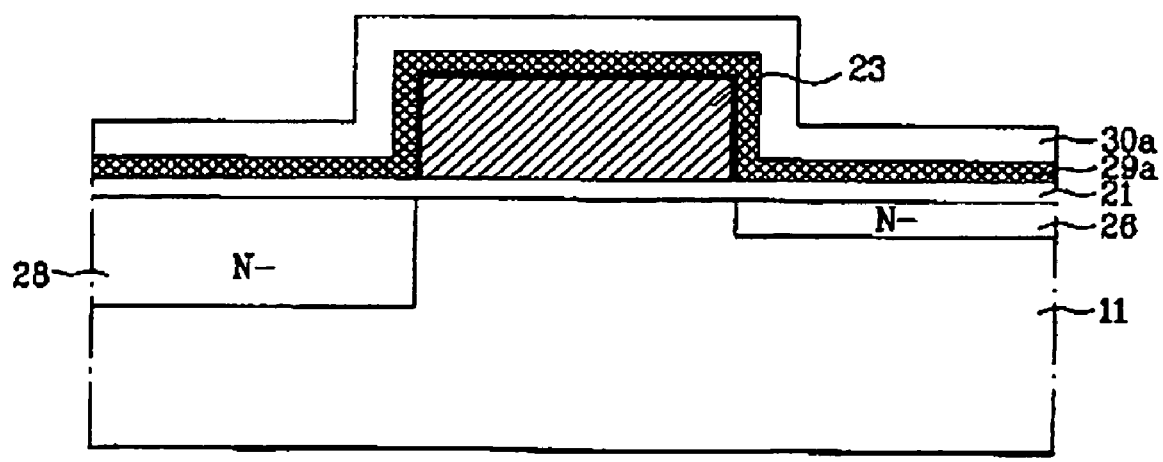
Figure 4F:
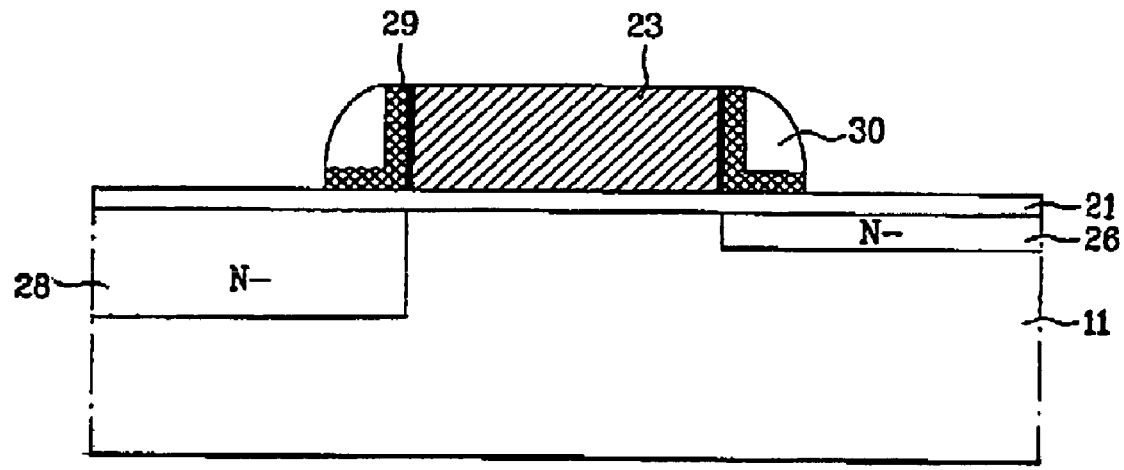
Figure 4G:
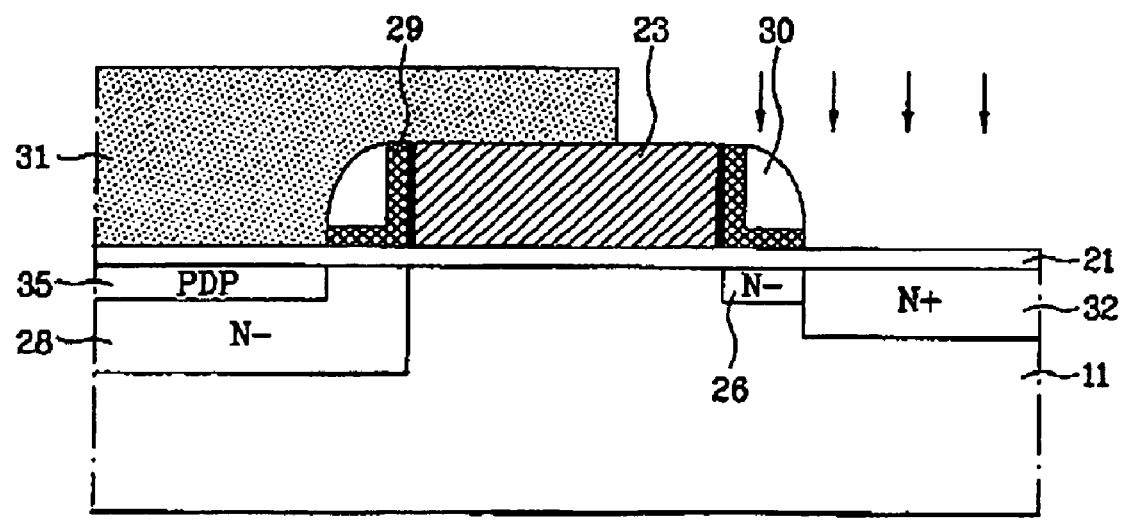
Figure 4H:
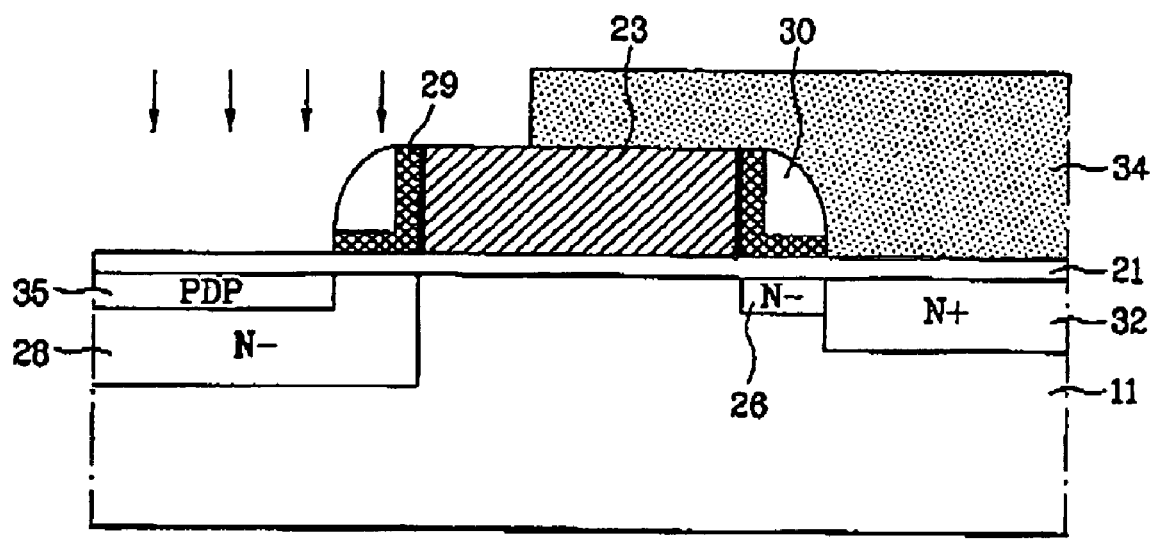
Figure 4I:
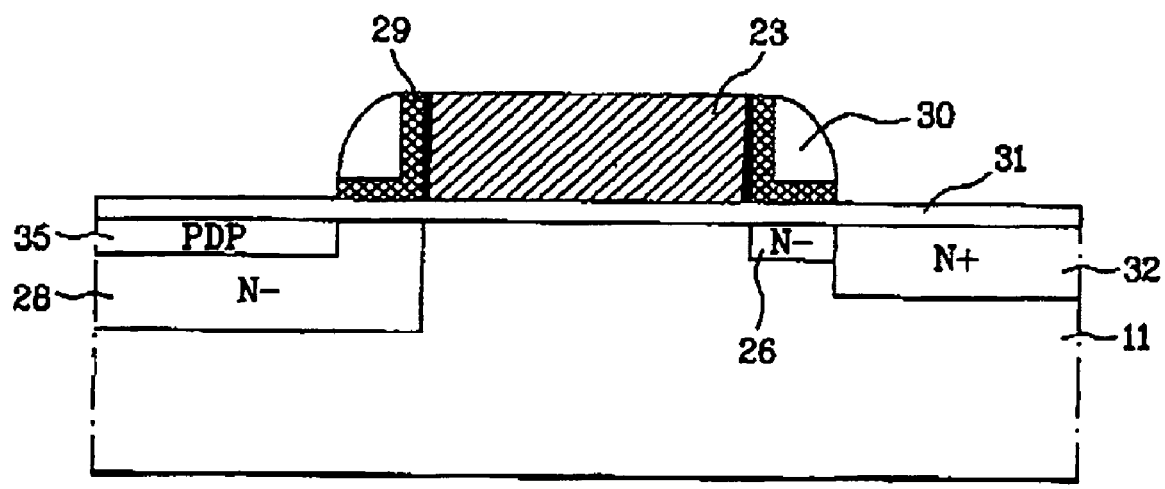
Figure 5:
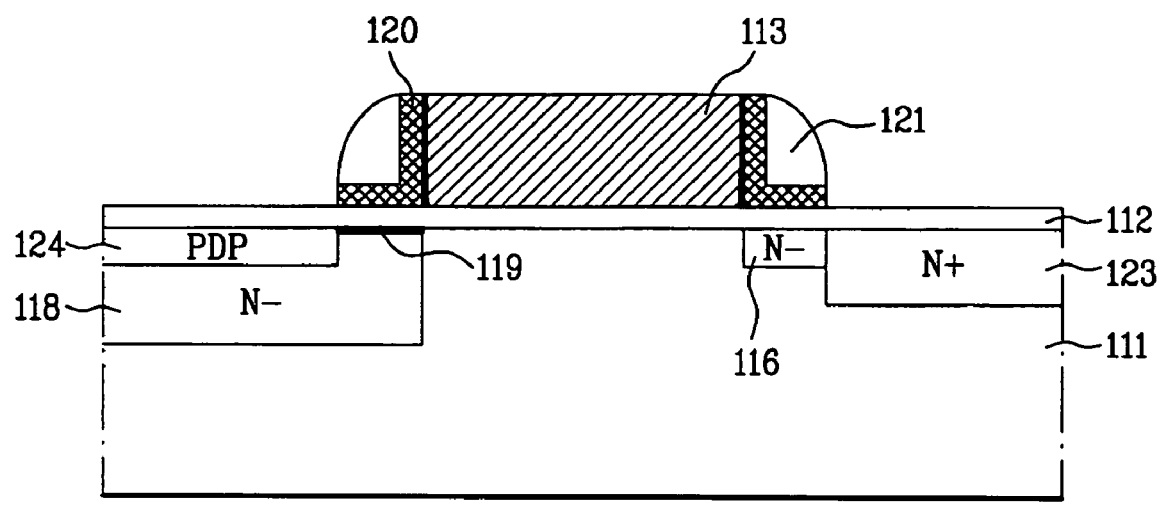
FIG. 5 is a cross-sectional view illustrating a photo diode and a transfer transistor of a CMOS image sensor according to the present invention.

FIG. 5 is a cross-sectional view illustrating a CMOS image sensor according to the present invention.

As shown in FIG. 5, a CMOS image sensor according to the present invention is formed on a semiconductor substrate (not shown) including an active region where a photo diode region and a transistor region are defined. The semiconductor substrate comprises a higher concentration of P-type silicon substrate, i.e., a P++ type single crystalline silicon substrate. In addition, a P– type epitaxial layer 111 can be formed on the substrate. A gate electrode 113 is formed on the active region of the substrate, interposing a gate insulating layer 112 the gate electrode and the active region. A N– type diffusion region 116 is formed in the transistor region at one side of the gate electrode 113. The N– diffusion, region 116 functions as a source or drain region of a transistor, more specifically, a lightly doped drain region. A N– type diffusion region 118 is also formed in the photo diode region at the other side of the gate electrode 113, deeper than the N– diffusion region 116. A pair of insulating sidewalls 120 and 121 is formed on both sides of the gate electrode 113. A N+ type diffusion region 123 is formed in the transistor region at one side of the gate electrode 113 and one of the insulating sidewall. In addition, P0 type diffusion regions 119 and 125 are formed over the N– diffusion region 118 in the photo diode region, extending to a region below one of the insulating sidewalls 120 and 121 close to the photo diode region.

FIGS. 6a to 6j are cross-sectional views illustrating a first embodiment of a method for manufacturing a CMOS image sensor according to the present invention.

Figure 6A:
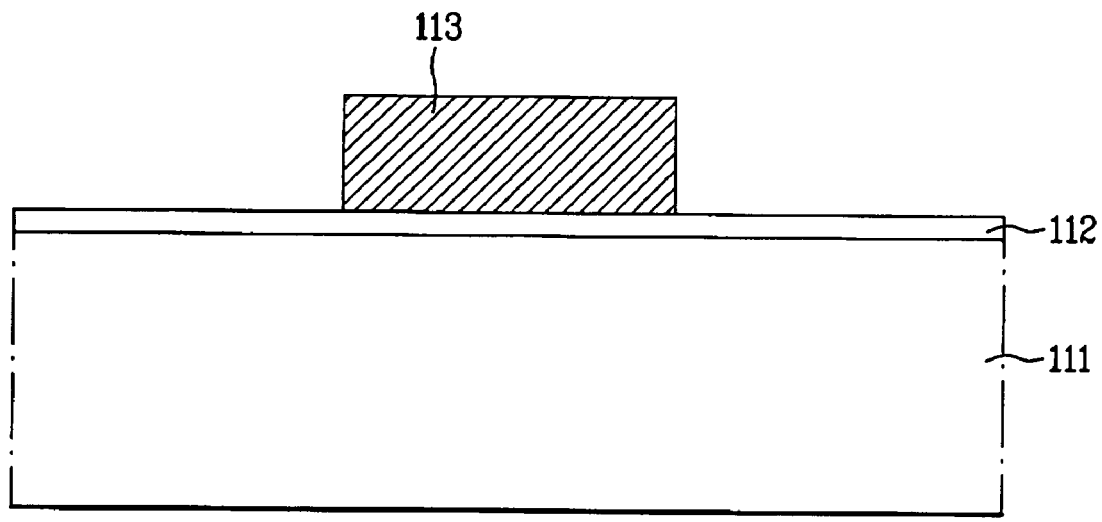
FIGS. 6a to 6j are cross-sectional views illustrating an embodiment of a method for manufacturing a CMOS image sensor according to the present invention.

Referring to FIG. 6a, the P– type epitaxial layer 111 is formed on the semiconductor substrate such as single crystalline silicon having a heavy concentration and a P-type conduction, i.e., a P++ type silicon substrate.

Here, the epitaxial layer 111 functions to form a deep and wide depletion region in the photo diode region. Thereby, the ability of a low voltage photo diode for gathering photoelectrons can be improved, and also the light sensitivity can be improved.

Next, a gate insulating layer 112 and a conductive layer (e.g., a heavy doped polysilicon layer) are deposited on the entire surface of the epitaxial layer 111, in successive order. The conductive layer is selectively patterned using photolithography and etching processes, thus forming the gate electrode 113.

The gate insulating layer 112 can be formed using thermal oxidation process or CVD process. In addition, the gate electrode 113 can comprise a silicide layer thereon.

Figure 6B:
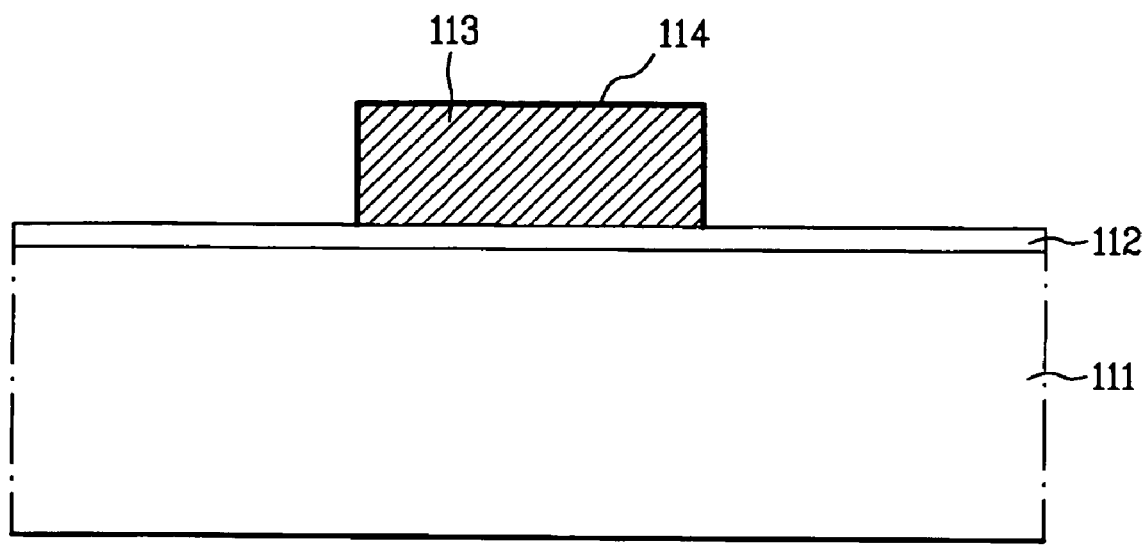

Next, as shown in FIG. 6b, the gate electrode 113 is thermally oxidized so that a thermal oxidation layer 114 is formed in a thickness of about 60 Å on the exposed surface of the gate electrode 113.

Figure 6C:
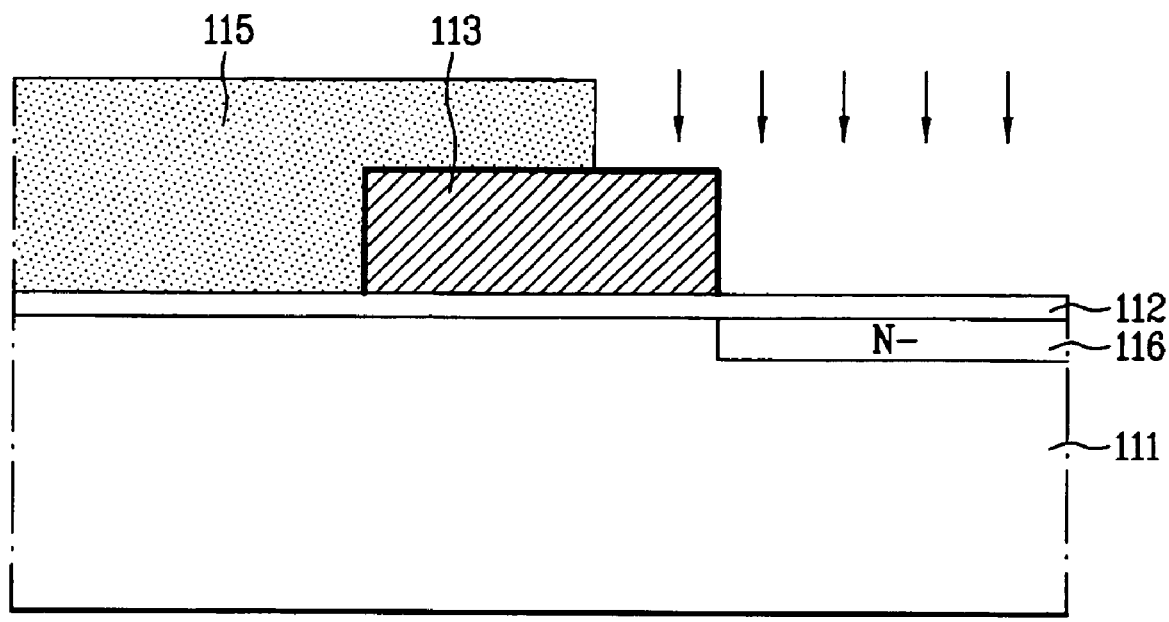

Referring to FIG. 6c, a first photoresist layer 115 is applied over the entire surface of the substrate including the gate electrode 113, and then it is patterned using exposure and development processes, thus covering the photo diode region and exposing the transistor region where source/drain regions will be formed.

Using the first photoresist pattern 115 as a mask, a low concentration of N– type dopant ions are implanted in the exposed transistor region to form the N– type diffusion region 116.

Figure 6D:
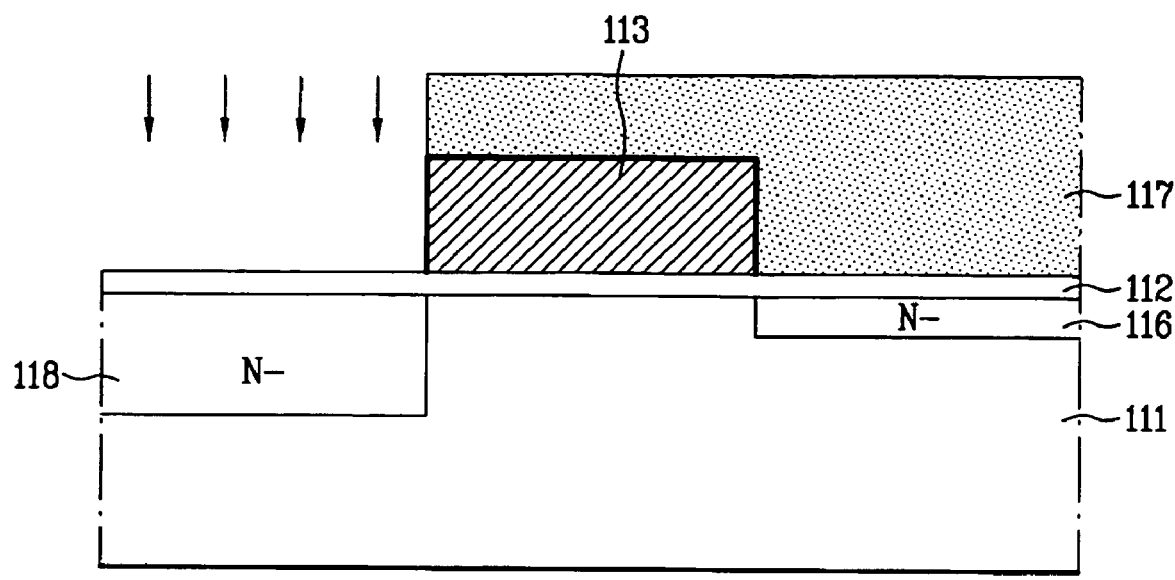

As shown in FIG. 6d, after removing the first photoresist pattern 115, a second photoresist layer 117 is applied over the semiconductor substrate, and then it is patterned using exposure and development processes, thus exposing the photo diode region.

Then, using the second photoresist pattern 117 as a mask, a low concentration of N-type dopant ions are implanted in the photo diode region at an ion implantation energy of 100 keV~500 keV, thus forming the N– type diffusion region 118. Hereinafter, the N– type diffusion region 118 is also referred to as "PDN region."

Meanwhile, the N– type diffusion region 118 of the photo diode region is preferably formed in a depth more than that of the N– type diffusion region 116 of source/drain regions, using higher implantation energy.

Figure 6E:
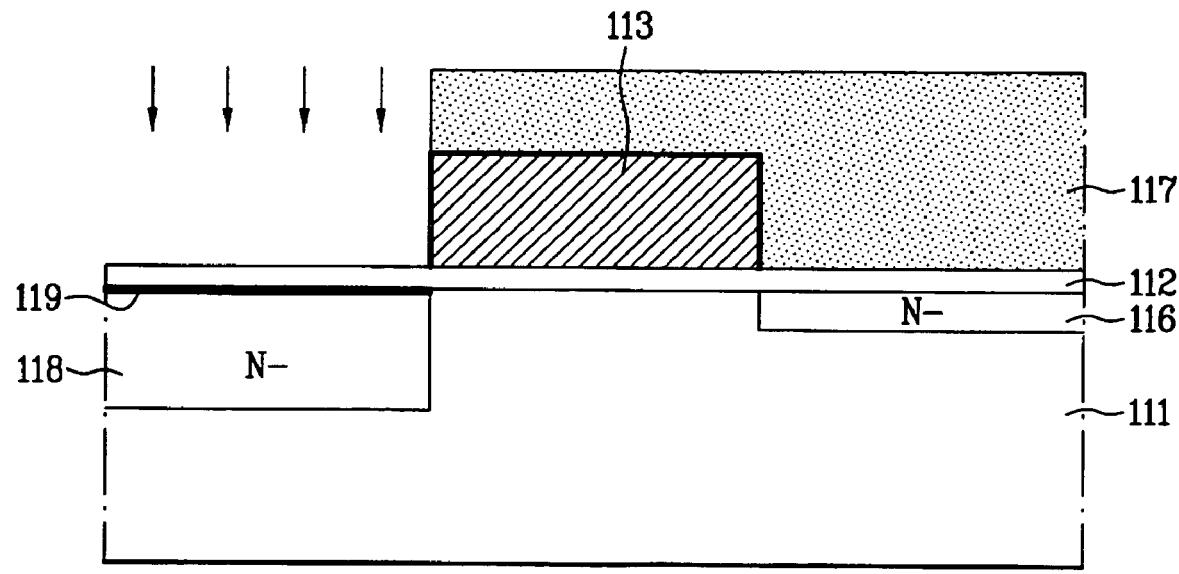

As shown in FIG. 6e, using the second photoresist pattern 117 as a mask, a middle concentration of P-type dopant ions are implanted in the vicinity of the surface of the exposed photo diode region where the N– type diffusion region 118 is already formed, thus forming a first P0 type diffusion region 119.

Here, the first P0 type diffusion region 119 is preferably formed using $BF_2$ as a dopant ion, under conditions comprising a dopant dose of from $1 \times 10^{16}$ atoms/$cm^2$ to $5 \times 10^{17}$ atoms/$cm^2$, and an ion implantation energy of from 5 keV to 20 keV.

Figure 6F:
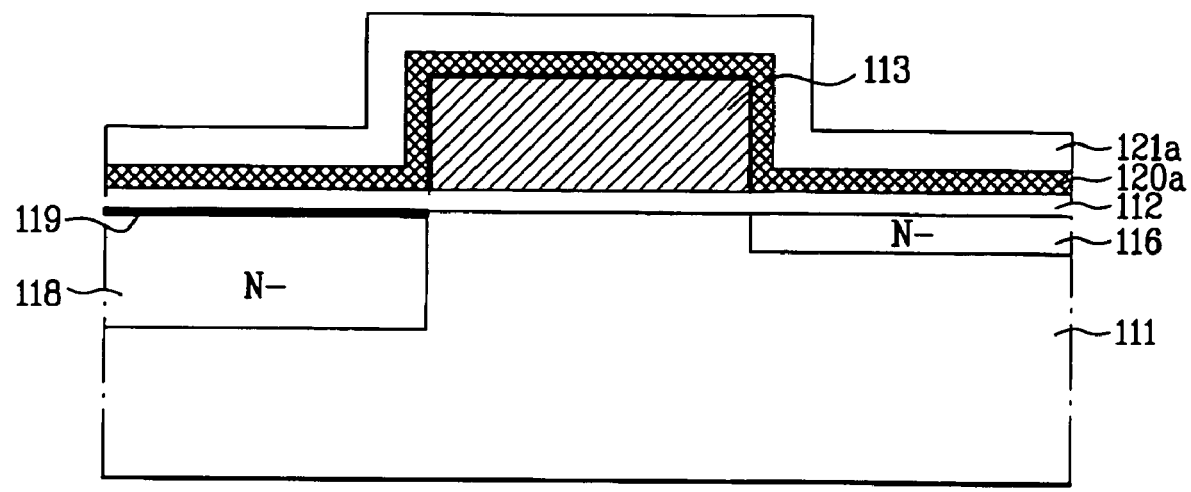

As shown in FIG. 6f, after removing the second photoresist pattern 117, the oxide layer 120a and the nitride layer 121a are formed over the entire surface of the substrate, using CVD, e.g., LPCVD process. Preferably, the oxide layer 120a is formed in a thickness of about 200 Å, and the nitride layer 121a is formed in a thickness of about 800 Å.

Figure 6G:
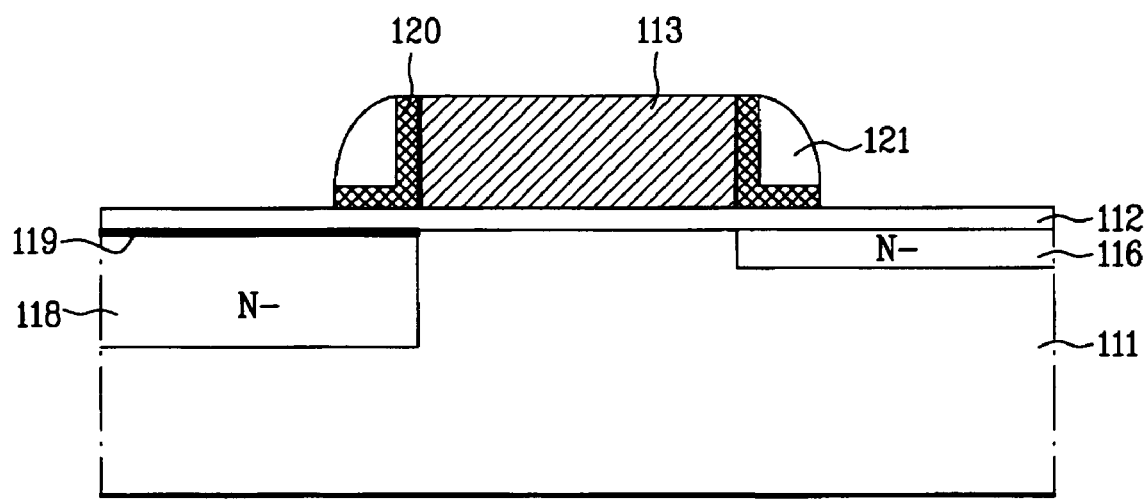

Continuously, an etch back process is preformed on the oxide layer 120a and the nitride layer 121a to form the first and second insulating sidewalls 120 and 121 on both sides of the gate electrode 113, as shown in FIG. 6g.

Figure 6H:
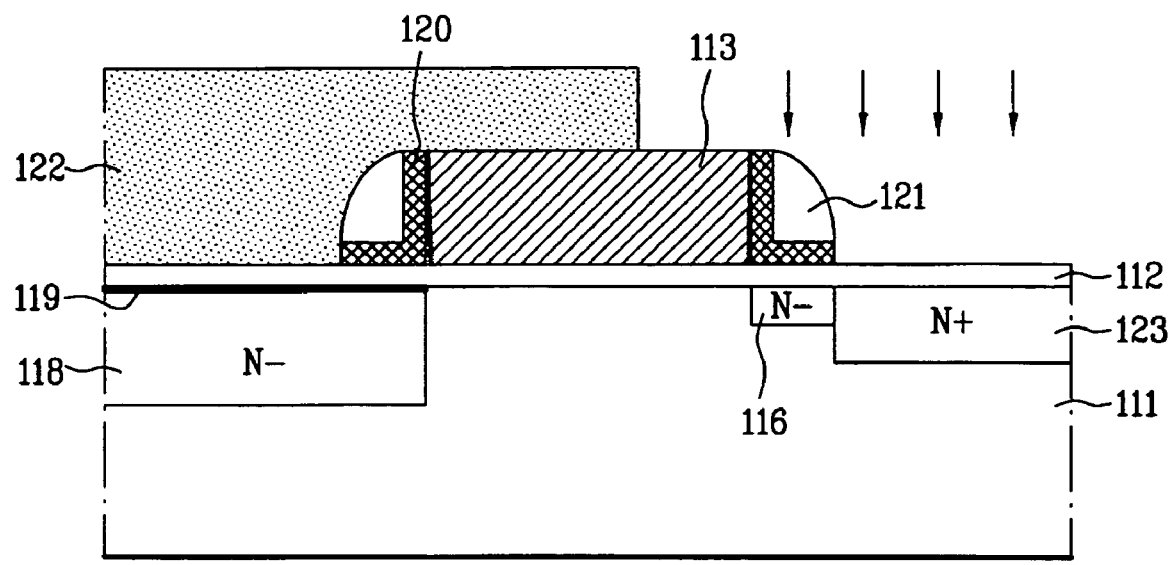

As shown in FIG. 6h, a third photoresist layer 122 is formed over the entire surface of the substrate, and then it is patterned by exposure and development processes, thus covering the photo diode region.

Continuously, using the third photoresist pattern 122 as a mask, a high concentration of N-type dopant ions are implanted in source/drain regions to form the N+ type diffusion region 123.

Figure 6I:
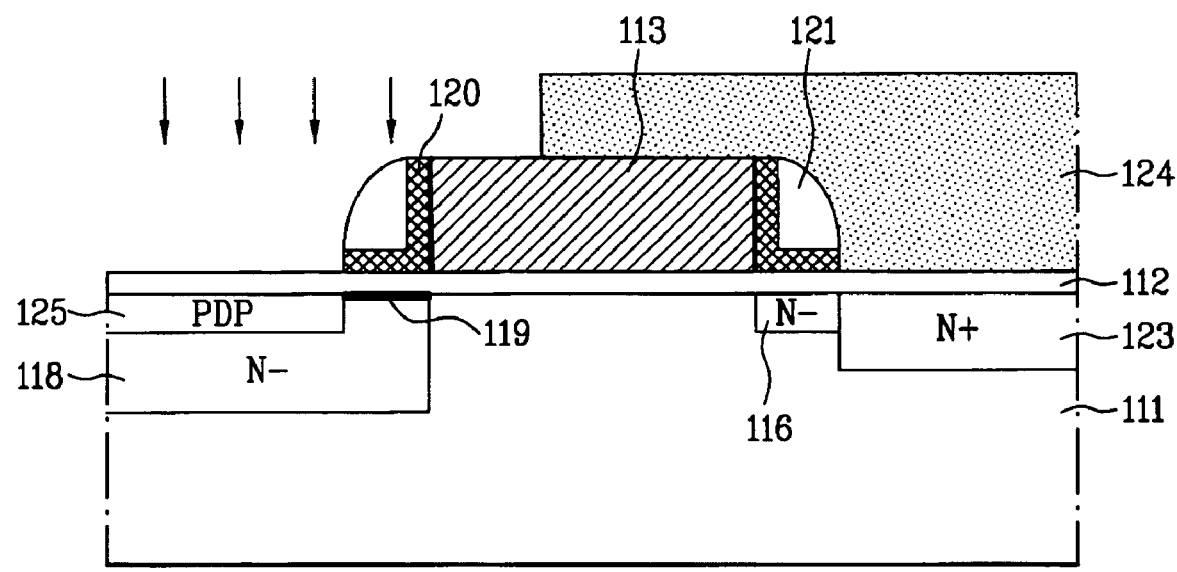

As shown in FIG. 6i, after removing the third photoresist pattern 122, a fourth photoresist layer 124 is applied over the entire surface of the substrate, and then it is patterned by exposure and development processes, thus exposing the photo diode region.

Then, using the fourth photoresist pattern 124 as a mask, a middle concentration of P-type dopant ions are implanted in the photo diode region to form a second P0 type diffusion region 125 over the N– type diffusion region 118. Preferably, the second P0 type diffusion region 125 is formed using higher dopant dose and ion implantation energy than those of the first P0 type diffusion region 119.

Figure 6J:
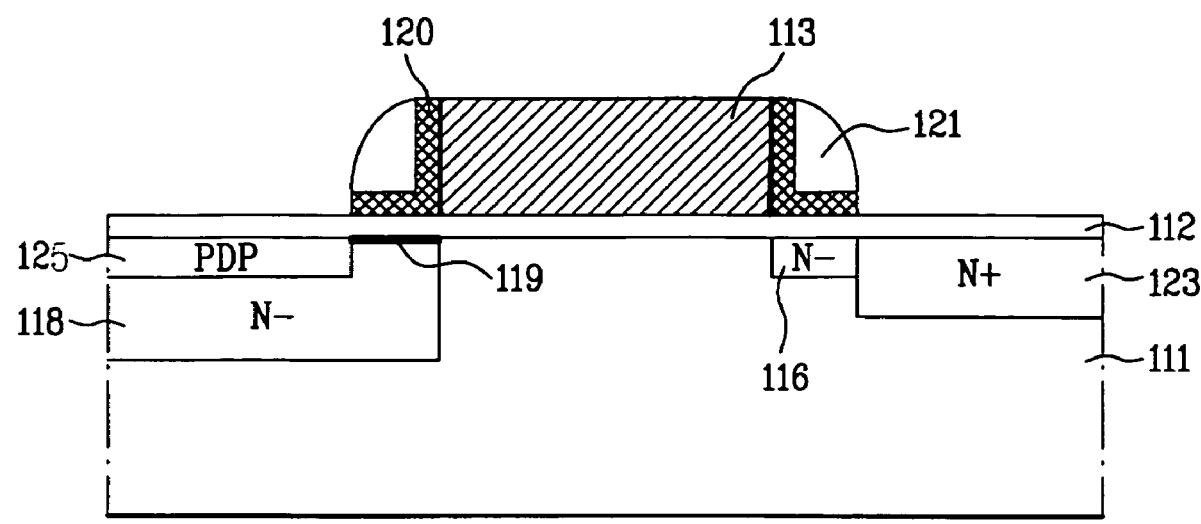

As shown in FIG. 6j, after removing the fourth photoresist pattern 124, heat-treatment process, e.g., rapid thermal process, is performed on the substrate at a temperature of from 800° C. to 1200° C., thus activating dopants in the N– type diffusion region 116, the first and second P0 type diffusion regions 119 and 125, the N– type diffusion region 118, and the N+ type diffusion region 123.

In the first embodiment of the present invention, the first P0 type diffusion region 119 is formed right after implantation process for the N– type diffusion region 118, and then the second P0 type diffusion region 125 is formed after forming the first and second insulating sidewalls 120 and 121. In other words, a P0 type diffusion region (i.e., PDP region) can be extended to the photo diode region below the first and second insulating sidewalls 120 and 121.

Figure 7A:
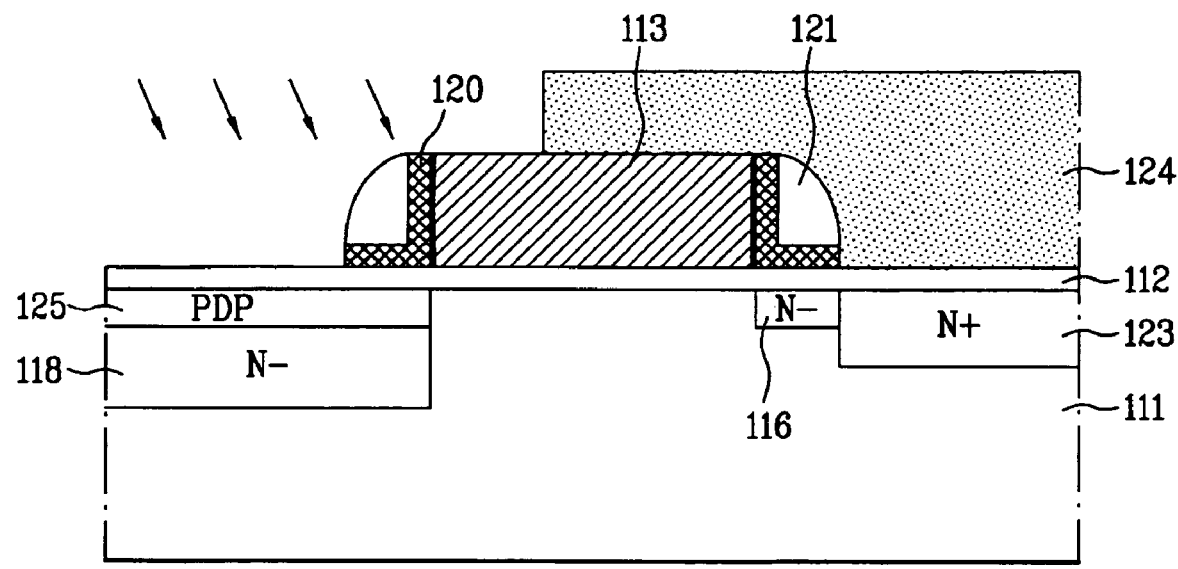
FIGS. 7a and 7b are cross-sectional views illustrating another embodiment of a method for manufacturing a CMOS image sensor according to the present invention.
Figure 7B:
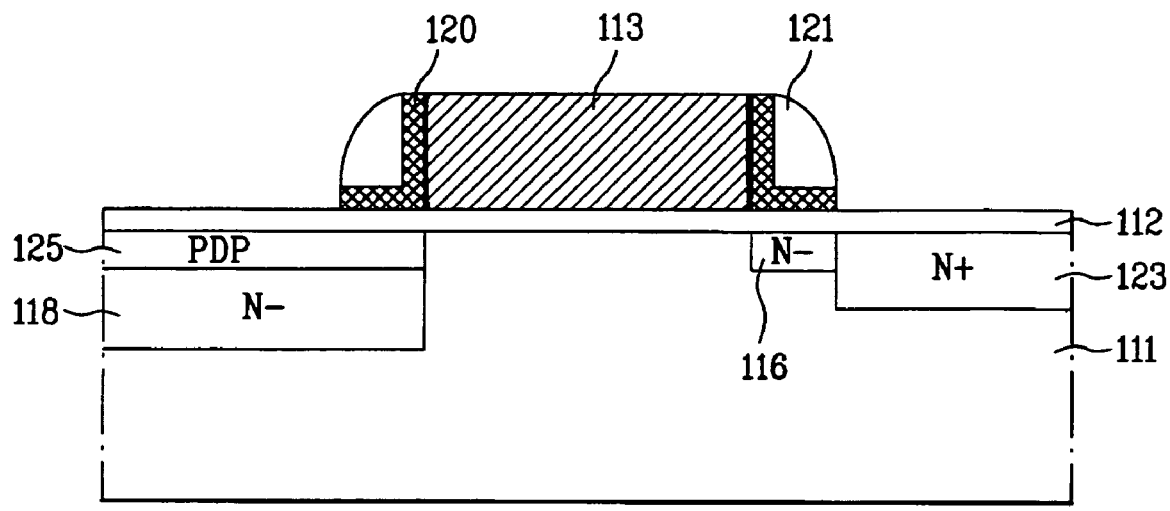

FIGS. 7a and 7b are cross-sectional views illustrating a second embodiment of a method for manufacturing a CMOS image sensor according to the present invention. Hereinafter, processes different from those of the first embodiment will be explained.

In the second embodiment, processes as shown in FIGS. 6a to 6c can be performed in the same manner as the first embodiment. Furthermore, the N– type diffusion region 118 is formed as shown in FIG. 6d. Then, omitting the process shown in FIG. 6e, the processes shown in FIGS. 6f to 6h are performed, similarly to the first embodiment.

Continuously, as shown in FIG. 7a, after removing the third photoresist pattern 122, a fourth photoresist layer 124 is applied over the substrate, and then it is patterned using exposure and development processes, thus exposing the photo diode region.

Using the fourth photoresist pattern 124 as a mask, a P0 type dopant ions are implanted in the photo diode region. In this case, if an implanting angle is tilted at a predetermined angle, the dopant ions can be implanted up to the region below the first and second insulating sidewalls 120 and 121. Thus, the P0 type diffusion region 125 can be extended to the region below the first and second insulating sidewalls 120 and 121.

As shown in FIG. 7b, after removing the fourth photoresist pattern 124, the substrate undergoes on heat treatment process at a temperature of 800° C.~1200° C., for example, using rapid thermal process, thus activating dopants in the N– type diffusion region 116, the P0 type extended diffusion region 125, the N– type diffusion region 118, and the N+ type diffusion region 123.

Figure 8:
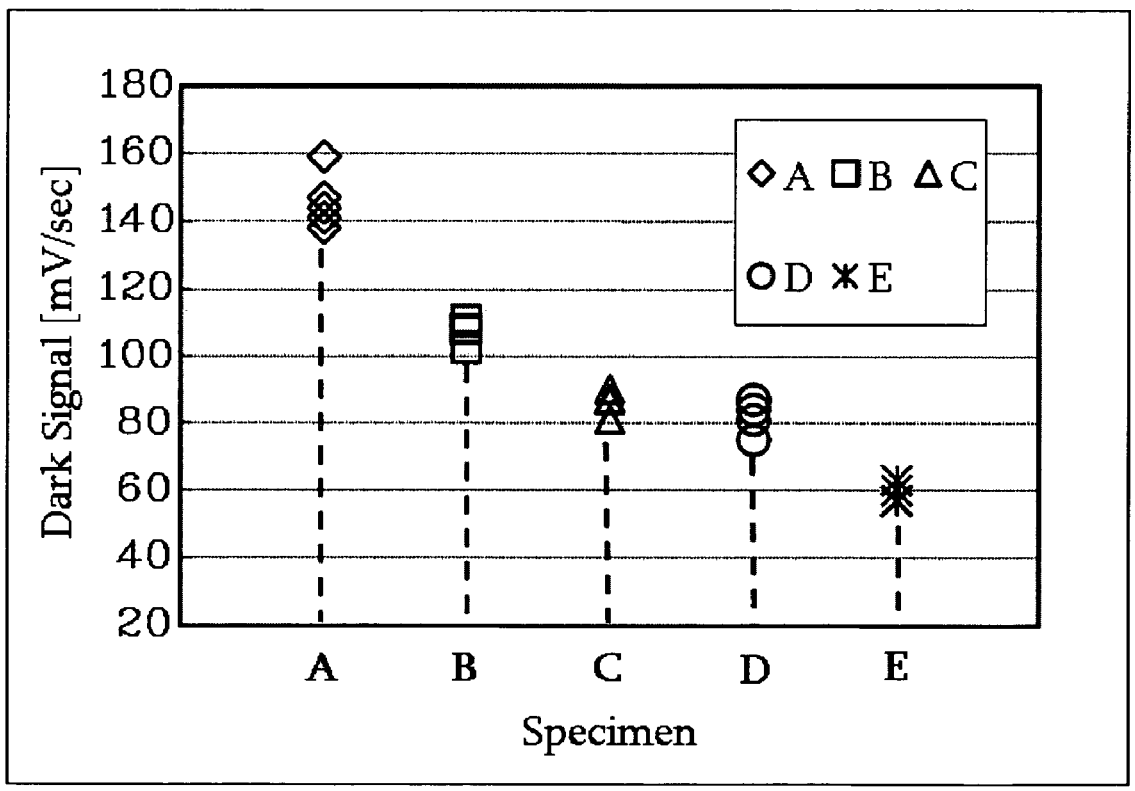

FIGS. 8 and 9 show results of the performance test on the CMOS image sensor according to the present invention and the conventional CMOS image sensor. Here, the specimens "A" and "B" represent CMOS image sensors manufactured by a conventional method, and the specimens "C", "D", and "E" represent CMOS image sensors manufactured by the present invention. Specifically, the specimens are manufactured under implantation conditions of Table 1.

TABLE 1

| Conditions (Dopant species; Dose; Implantation Energy) | | A | B | C | D | E |
|---|---|---|---|---|---|---|
| 1st PDP Implantation | $BF_2$; 1.0E12; 10 keV | | | O | O | |
| | $BF_2$; 2.0E12; 10 keV | | | | | O |
| 2nd PDP Implantation | $BF_2$; 3.2E12; 20 keV | O | | O | | |
| | $BF_2$; 6.4E12; 20 keV | | O | | O | O |

In Table 1, the 1st PDP implantation is performed before forming insulating sidewalls 120 and 121 to form the first P0 type diffusion region 119. In addition, the 2nd PDP implantation is performed after forming insulating sidewalls to form the second P0 type diffusion region 125. In the specimens A and B, the 1st PDP implantation process is omitted according to the conventional method.

As shown in FIGS. 8 and 9, a dark current can be typically reduced relative to increase of $BF_2$ dose in the second P0 type diffusion region. Namely, the dark current of specimen B is reduced by about 25%, comparing with that of specimen A. On the other hand, comparing specimen A with specimen C (or D), the dark current of specimen C or D is reduced by about 43%. Especially, in the case where dose $BF_2$ in the first P0 type diffusion region (i.e., in the region right below the insulating sidewalls) becomes increased, reduction of the dark current becomes conspicuous. Namely, referring to FIGS. 8 and 9, the dark current of specimen E is reduced by about 60% comparing with that of specimen A.

The results of experiment in FIGS. 8 and 9 shows that the first PDP implantation can isolate electrically the photo diode from the silicon surface below the insulating sidewalls of the transfer transistor. Thus, it can reduce effectively the dark current, redundant electrons which can be generated from the $Si/SiO_2$ interface below the insulating sidewalls of the transistor.

According to the present invention, the dark signal characteristics in a CMOS image sensor can be remarkably improved, because the additional extended PDP region formed below the insulating sidewalls of the transistor can isolate the PDN region of the photo diode from the $Si/SiO_2$

What is claimed is:

1. A method for manufacturing a CMOS image sensor, comprising the steps of:
   forming a first mask over a semiconductor substrate including a gate electrode to expose a transistor region on a first side of the gate electrode and cover a photodiode region on a second side of the gate electrode;
   forming a first lightly doped drain in the transistor region with the first mask over the photodiode region, including a first dopant having a first conductivity type;
   removing the first mask;
   forming a second mask to expose the photodiode region and cover the transistor region;
   forming a first photodiode diffusion region substantially aligned with a gate sidewall on the second side of the gate electrode with the second mask over the transistor region, the first photodiode diffusion region including a second dopant having the first conductivity type;
   forming a second photodiode diffusion region substantially aligned with the gate sidewall on the second side of the gate electrode over or in the first photodiode diffusion region with the second mask over the transistor region, the second photodiode diffusion region including a third dopant having a second conductivity type;
   removing the second mask and forming insulating sidewalls on the first and second sides of the gate electrode;
   forming a third mask to cover the photodiode region and expose the transistor region;
   forming a source/drain diffusion region in the transistor region with the third mask over the photodiode region and the insulating sidewall on the second side of the gate electrode covering a portion of the first lightly doped drain, the source/drain diffusion region partially overlapping with the lightly doped drain and including a fourth dopant having the first conductivity type;
   removing the third mask;
   forming a fourth mask to expose the photodiode region and cover the transistor region; and
   forming a third photodiode diffusion region substantially aligned with an outer sidewall of the insulating sidewall on the second side of the gate electrode over or in the photodiode region, the insulating sidewall in the photodiode region covering a portion of the first and second photodiode diffusion regions, the third photodiode diffusion region partially overlapping the first photodiode diffusion region, and including a fifth dopant having the second conductivity type, wherein the third photodiode diffusion region has a higher dopant concentration than that of the second photodiode diffusion region.

2. The method of claim 1, wherein the third photodiode diffusion region has a depth greater than that of the second photodiode diffusion region.

3. The method of claim 1, further comprising the step of thermally oxidizing a surface of the gate electrode before the step of forming the insulating sidewalls.

4. The method of claim 1, wherein the third dopant having the second conductivity type comprises boron.

5. The method of claim 4, wherein forming the second photodiode diffusion region comprises implanting $BF_2$ ions.

6. The method of claim 5, wherein the $BF_2$ ions are implanted at a dopant dose of from $1 \times 10^{16}$ atoms/cm$^2$ to $5 \times 10^{17}$ atoms/cm$^2$.

7. The method of claim 5, wherein the $BF_2$ ions are implanted at an energy of from 5 keV to 20 keV.

8. The method of claim 1, further comprising the step of heat-treating the semiconductor substrate after the step of forming the third photodiode diffusion region.

9. The method of claim 1, further comprising the steps of:
   defining an active region including the photodiode region and the transistor region in the semiconductor substrate; and
   forming the gate on the transistor region, comprising a gate insulating layer and a gate electrode thereon.

10. The method of claim 1, wherein the first conductivity type is n-type and the second conductivity type is p-type.

* * * * *